Figure 1:
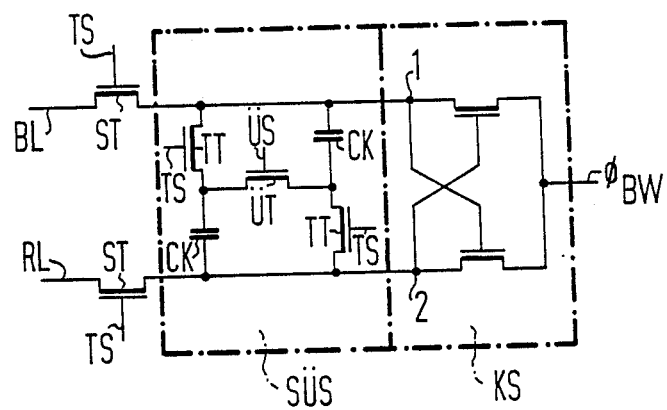

United States Patent [19]

Kraus

[11] Patent Number: 4,841,180
[45] Date of Patent: Jun. 20, 1989

[54] INTEGRABLE EVALUATING CIRCUIT

[75] Inventor: Rainer Kraus, Munich, Fed. Rep. of Germany

[73] Assignee: Siemens Aktiengesellschaft, Berlin and Munich, Fed. Rep. of Germany

[21] Appl. No.: 74,764

[22] Filed: Jul. 17, 1987

[30] Foreign Application Priority Data

Jul. 24, 1986 [DE] Fed. Rep. of Germany ....... 3625020

[51] Int. Cl.$^4$ .................... G01R 19/00; H03K 17/687; H03K 17/16; H03K 19/017
[52] U.S. Cl. ..................................... 307/530; 307/443; 307/448; 307/571; 307/577
[58] Field of Search ............... 307/443, 448, 571, 577, 307/530, 279

[56] References Cited

U.S. PATENT DOCUMENTS

| | | | |
|---|---|---|---|
| 4,119,870 | 10/1978 | Zibert | 307/279 |
| 4,162,539 | 7/1979 | Hebenstreit | 365/149 |
| 4,542,306 | 9/1985 | Ikeda | 307/279 |

*Primary Examiner*—John Zazworsky
*Assistant Examiner*—Margaret Rose Wombach
*Attorney, Agent, or Firm*—Herbert L. Lerner; Laurence A. Greenberg

[57] ABSTRACT

An integrable evaluating circuit includes a trigger circuit, a first and a second circuit node, both of which serve both as inputs and as mutually-complementary outputs for the trigger circuit, a pair of signal lines exhibiting the same potential in a rest state, switching transistors each being connected between a respective one of the two circuit nodes and a respective signal line of the pair of signal lines, and a signal-enhancement circuit connected between the trigger circuit and the pair of signal lines. A signal occurring on a given one of the two signal lines is initially connected with its signal deviation to the circuit node connected to the given signal line. The switching transistor connected to the given one of the two signal lines is then blocked and cuts off the signal from the circuit node connected to the given signal line. The signal-enhancement circuit then increases the potential at the circuit node connected to the given signal line by a given amount while simultaneously reducing the potential at the other of the two circuit nodes as a result of potential shift. The potential of the circuit node connected to the given signal line is reduced and the potential of the other of the two circuit nodes is increased if the signal has a negative signal deviation.

11 Claims, 3 Drawing Sheets

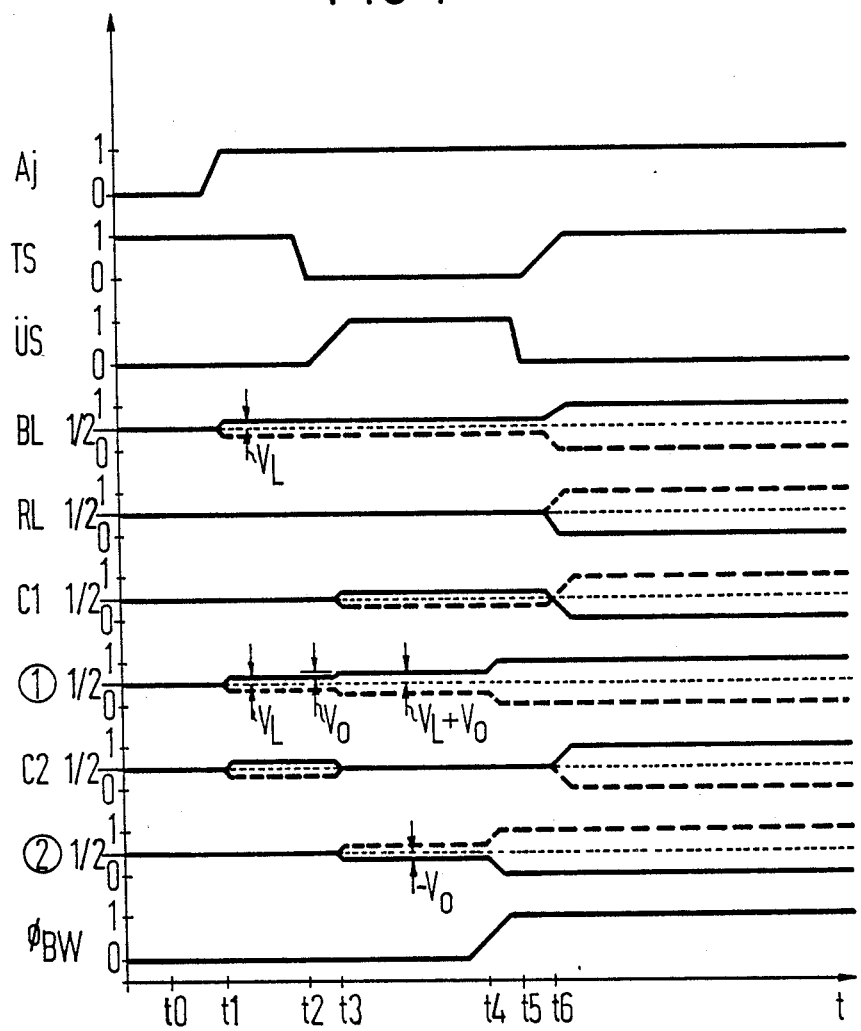

INTEGRABLE EVALUATING CIRCUIT

The invention relates to an integrable evaluating circuit including a trigger circuit, first and second circuit nodes, both of which serve both as inputs and as mutually-complementary outputs for the trigger circuit, the two circuit nodes being connected through switching transistors to a pair of signal lines which exhibit the same potential in a rest state.

Figure 2:
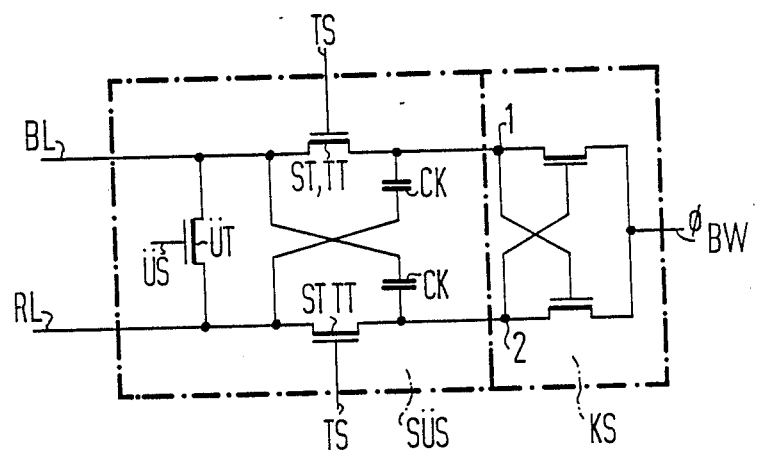
Figure 3:
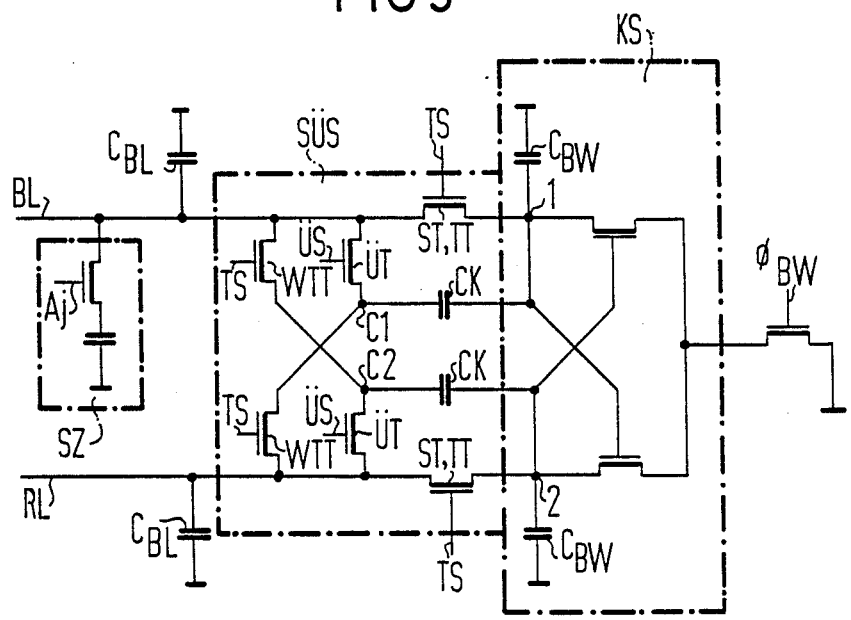

Integrable evaluating circuits of the type in question are used for the reliable recognition and differentiation of logic levels of electric signals, especially in cases in which the various logic levels which are to be evaluated differ only very slightly from one another in terms of voltage. Their best known use is that of so-called sense amplifiers in integrated semiconductor memories, such as for example DRAM's and SRAM's. The many publications which relate to integrable evaluating circuits of the type in question include the following:

(1) IEEE International Solid State Circuits Conference, 1980 Digest of Technical Papers, Pages 228 to 229, in particular FIG. 3, representing a DRAM, and (2) IEEE International Solid State Circuits Conference, 1984 Digest of Technical Papers, Pages 226 to 227, in particular FIG. 2, representing a SRAM.

Both circuits are operated under conditions of use typical of integrable evaluating circuits of the type in question: The evaluating circuit, also known as a sense amplifier, is connected through isolating transistors to a pair of bit lines. In read operation it is supplied through one of the bit lines with a read signal read out from an addressed memory or storage cell. A potential previously supplied to the other bit line, for example by means of a precharge circuit, initially retains its value or changes slightly as a result of the use of a so-called dummy cell. Dummy cells are memory or storage cells which do not actually store information. They are required in the known high-level concept or low-level concept to generate a reference signal in association with the known use of two cross-coupled transistors, which form a bistable trigger circuit, as an evaluating circuit. Their use is not essential, but it is possible in the case of the known mid-level concept (symmetrisation of the signals "logic 0" and "logic 1").

The problems which occur are always the same, regardless of the known circuit concepts which are used: to enable the evaluating circuit to reliably respond and to carry out correct evaluation, when a memory or storage cell is read out onto a bit line, which in fact represents a large capacitive load for the read signal, and the occurring signal deviation must not fall below a specified (low) value. Conventional evaluating circuits have a response threshold of 50 mV, for example, and typical read signal deviations in good semiconductor memories are 150±100 mV. In semiconductor memories, the value of the read signal is directly proportional to the memory or storage capacity of the connected memory or storage cells, and in dynamic semiconductor memories it is even directly proportional to the capacity of each individual memory or storage cell capacitor, and thus also directly proportional to the area required by each individual memory or storage capacitor.

It is accordingly an object of the invention to provide an integrable evaluating circuit, which overcomes the hereinafore-mentioned disadvantages of the heretofore-known devices of this general type and to do so in such manner that even very small read signals which are fed to signal lines and which cannot be processed by conventional evaluating circuits can be reliably recognized and amplified.

With the foregoing and other objects in view there is provided, in accordance with the invention, an integrable evaluating circuit, comprising a trigger circuit, a first and a second circuit node, both of which serve both as inputs and as mutually-complementar outputs for the trigger circuit, a pair of signal lines exhibiting the same potential in a rest state, switching transistors each being connected between a respective one of the two circuit nodes and a respective signal line of the pair of signal lines, and a signal-enhancement circuit connected between the trigger circuit and the pair of signal lines, the switching transistors initially connecting a signal occurring on a given one of the two signal lines with its signal deviation to the circuit node connected to the given signal line, the switching transistor connected to the given one of the two signal lines then blocking and cutting off the signal from the circuit node connected to the given signal line, the signal-enhancement circuit then increasing the potential at the circuit node connected to the given signal line by a given amount while simultaneously reducing the potential at the other of the two circuit nodes as a result of a potential shift, and the signal-enhancement circuit reducing the potential of the circuit node connected to the given signal line and increasing the potential of the other of the two circuit nodes if the signal has a negative signal deviation.

In accordance with another feature of the invention, the signal-enhancement circuit includes at least first and second coupling capacitors each having first and second electrodes, the first electrode of the first coupling capacitor being connected to the first circuit node, and the first electrode of the second coupling capacitor being connected to the second circuit node, the signal-enhancement circuit includes a first transfer transistor having a gate in the form of a control terminal receiving a transfer signal, and controlled terminals each being connected to the second electrode of a respective one of the coupling capacitors, and isolating transistors each having one controlled terminal connected to a respective one of the first electrodes of the coupling capacitors, a gate receiving an isolating signal, and another controlled terminal connected to a respective one of the second electrodes of the coupling capacitors.

In accordance with a further feature of the invention, the switching transistors have current-conducting paths each being connected between a signal line of the pair of signal lines and the trigger and signal-enhancement circuits.

In accordance with an added feature of the invention, there are provided a two further isolating transistor each having a current-conducting path, the signal-enhancement circuit including at least one further transfer transistor having a gate in the form of a control terminal receiving the transfer signal, a first controlled terminal of each of said transfer transistors being connected to the second electrode of a respective one of the coupling capacitors, and a second controlled terminal of each of said transfer transistors being connected to the other controlled terminal of a respective one of the isolating transistors and through the current-conducting path of a respective one of the further isolating transistors to the second electrode of the other of the coupling capacitors.

In accordance with an additional feature of the invention, the switching transistors serve as isolating transistors.

In accordance with yet another feature of the invention, the coupling capacitors have equal capacitance values.

In accordance with yet a further feature of the invention, the trigger circuit has a self-capacitance value and the coupling capacitors have capacitance values approximately equal to the self-capacitance value.

In accordance with yet an added feature of the invention, the capacitance values of the coupling capacitors are between 20 and 40 fF.

In accordance with yet an additional feature of the invention, the transfer transistors are switched into conductivity at the earliest when the isolating transistors are blocked.

In accordance with still another feature of the invention, the transfer signal has a lateral edge bringing the transfer signal into an active state with a less steep lateral edge gradient than a corresponding opposing lateral edge thereof.

In accordance with a concomitant feature of the invention, the isolating signal has a lateral edge bringing the isolating signal into an active state with a less steep lateral edge gradient than a corresponding opposing lateral edge thereof.

Other features which are considered as characteristic for the invention are set forth in the appended claims.

Although the invention is illustrated and described herein as embodied in an integrable evaluating circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIGS. 1 to 3 are schematic circuit diagrams of various embodiments of the invention; and FIG. 4 is a pulse diagram.

Referring now to the figures of the drawings in detail and first, particularly, to FIGS. 1-3 thereof, it is seen that each embodiment of the integrable evaluating circuit in accordance with the invention contains a trigger circuit KS which is known per se. The trigger circuit KS can be formed in the usual manner of two cross-coupled transistors, where, for example, the source zones of the two transistors are electrically connected to one another The electric potential carried by this connection is variable in order to enable the evaluation to be performed. For example, an evaluating signal $\phi_{BW}$ connectible to reference potential, can be directly connected according to FIGS. 1 and 2 or a transistor can be connected, which is connected to the reference potential and is controlled by the evaluating signal $\phi_{BW}$ according to FIG. 3. Complex function generators are also known which permit a special signal course at the above-mentioned connection. However this is generally known, it does not form part of the invention, and it is mentioned merely for completeness and to facilitate an understanding of the mode of operation of the invention.

The trigger circuit KS includes a first circuit node 1 and a second circuit node 2, both of which serve in the normal way both as inputs and as mutually-complementary outputs for the trigger circuit KS. The two circuit nodes 1, 2, and thus the entire trigger circuit KS, are each connected to a pair of signal lines BL, RL through a switching transistor ST which is driven at its gate by an isolating signal TS. In the event that the integrable evaluating circuit is incorporated in a semiconductor memory, this pair of signal lines BL, RL is referred to as a pair of bit lines or a pair formed of a bit line and a reference line. This is regardless of whether the semiconductor memory is constructed in accordance with the folded bit line concept or the open bit line concept. In the case of a semiconductor memory, each pair of signal lines is generally also connected to a precharge device, possibly combined with a line potential compensating or balancing circuit, and possibly a rewrite device for rewriting the information read out from a memory or storage cell. However, these devices are not directly linked to the present invention and therefore they have been omitted from the drawings for this reason and for reasons of clarity. Similarly, with the exception of FIG. 3, no signal sources which generate the signal to be evaluated, such as for example memory or storage cells, have been shown in the drawings.

In a rest state, shortly before a signal is read out onto one of the signal Lines BL, RL, the pair of signal lines BL, RL each carry the same potential. In the case of semiconductor memories, in traditional structures (e.g. with 64k-DRAM's and 256k-DRAM's) this potential is either the reference potential ground or the supply potential $V_{CC}$. However, the so-called mid-level concept is being used increasingly today. In this case the above-mentioned potential initially carried by the two signal lines BL, RL, is approximately half the value of the supply voltage. However, the value of the potential on the signal lines BL, RL is immaterial to the present invention. What is important is that the potential on the two signal lines BL, RL is at least approximately equal (with a maximum permissible difference of 10 mV).

The previously-described features of the evaluating circuit in accordance with the invention, which are contained in this form in all the embodiments of the invention that are to be described with regard to FIGS. 1 to 3, are generally known. They are also disclosed, for example, in the publications referred to above.

According to the subject of the present invention, a signal circuit SÜS is advantageously disposed between the trigger circuit KS and the pair of signal lines BL, RL.

If a signal which is to be evaluated occurs on one of the two signal lines BL, RL, such as on the signal line BL (in the above-described example of a semiconductor memory this state occurs when the information stored in a memory or storage cell assigned to the signal lines BL, which is the bit line, is read out), this signal, with a signal elevation $V_L$ according to FIG. 4, is initially connected to the circuit node which is connected to the signal-conducting signal line BL (for example the first circuit node 1). In accordance with the invention, the signal is then electrically cut off from the aforesaid circuit node 1. This is carried out by blocking the switching transistor ST located on the first signal line BL, by means of the isolating signal TS.

Following this blockage, the signal-enhancement circuit SÜS advantageously increases by means of a potential shift, by an amount $V_o$, the potential at the circuit node 1, which is composed of the potential of the original precharge and that of the read signal deviation $V_L$. Simultaneously the potential at the circuit node 2 is reduced by the same amount $V_o$.

The trigger circuit KS which would have to evaluate a potential elevation of $V_L$ in the present case in known evaluating circuits, which is the signal elevation between the two circuit nodes 1,2, in accordance with the invention when the (original) signal is unchanged, has a potential difference of $V_L + 2V_o$ between the two circuit nodes 1, 2 available for evaluation.

The same applies to a signal which is to be evaluated and which has a negative signal elevation $-V_L$.

A few advantageous embodiments of the signal-enhancement circuit SÜS will be described below. All of the embodiments are based on the principle that the signal-enhancement circuit SÜS includes at least two coupling capacitors CK. The first electrode of the first coupling capacitor CK is connected to the first circuit node 1. The first electrode of the other coupling capacitor CK is connected to the second circuit node 2. The signal-enhancement circuit SÜS also contains at least one transfer transistor ÜT, the gate of which is connected as control terminal to a transfer signal ÜS. The controlled drain and source terminals of each transfer transistor ÜT are each connected at least indirectly to two terminals of the coupling capacitors CK. In each case one df the controlled terminals (e.g. source) of an isolating transistor TT is connected to the first electrodes of one of the coupling capacitors CK. The gates of the isolating transistors TT are connected to an isolating signal TS. The other controlled terminal (e.g. drain) of the first of the two isolating transistors TT is connected to the second electrode of the other coupling capacitor CK. Accordingly, the other control terminal (e.g. the drain) of the other of the two isolating transistors TT is connected to the second electrode of the first coupling capacitor CK.

The mode of operation of a first embodiment of the invention will be explained in detail below making reference to FIG. 1. In the FIG. 1 embodiment, the current-conducting paths of the switching transistors ST are each connected between one of the pair of signal lines BL, RL on one hand and the trigger circuit KS and the signal-enhancement circuit SÜS on the other hand. The mode of operation will be explained with regard to FIG. 1 and with regard to the other embodiments, on the basis of the following concrete assumptions: the pair of signal lines BL, RL will be assumed to be a pair of bit lines of a semiconductor memory, composed of a bit line BL and a reference line RL. The memory or storage cell array of the semiconductor memory will be assumed to contain no dummy cells (however the circuit in accordance with the invention also functions in the presence of dummy cells). The bit line BL is to designate the signal line on which the read-out information appears as a signal to be evaluated during the read-out process (as a result of the selection of a memory or storage cell through the corresponding word line). The other, unselected signal line is referred to as a reference line RL. A further assumption, which is unnecessary for the functioning of the circuit in accordance with the invention, is that before the start of the read-out process the two signal lines BL, RL each carry half the supply voltage potential. This can be achieved in a conventional manner by means of a so-called precharge circuit in combination with a balancing circuit.

At the start of the read-out process the isolating signal TS is active and the transfer signal ÜS is inactive. The switching transistors ST and the isolating transistors TT are fully open, whereas the transfer transistor ÜT is blocked. The first circuit node 1, the first terminal of the first coupling capacitor CK. and one of the two controlled terminals of the transfer transistor ÜT are connected to half the supply voltage potential (e.g. 2.5 V), modified by the read-out read signal with its signal elevation $V_L$ (e.g. 150 mV). If a logic "1" is read out (in the use of n-channel transistors and positive logic), the connected potential is increased by the read signal elevation $V_L$ and otherwise in the case of a logic "0" it is reduced accordingly.

The second circuit node 2, the first electrode of the other coupling capacitor CK, and the other of the two controlled terminals of the transfer transistor ÜT are unchanged at half the supply voltage potential of e.g. 2.5 V. As those skilled in the art will be aware, the trigger circuit KS is maintained in a unstable state of equilibrium, for example through the evaluating signal $\phi_{BW}$.

The isolating signal TS then assumes its inactive state, whereupon the switching transistors ST and the isolating transistors TT are blocked. Following this blockage, the transfer signal ÜS is activated, whereupon transfer transistor ÜT is switched through. During the (shortest possible) period of time in which the isolating signal TS was (already) de-activated and the transfer signal ÜS was (still) de-activated, the first controlled terminal of the transfer transistor ÜT was connected to a potential increased by the amount of the read signal elevation $V_L$ (or, in the case of the read-out of a logic "0" reduced by this amount), compared with the potential at the other controlled terminal of the transfer transistor ÜT. As a result of the activation of the transfer signal ÜS, a potential compensation is effected through the transfer transistor ÜT, which results in a potential increase at the other controlled terminal of the transfer transistor ÜT, and thus also at the second electrode of the coupling capacitor CK which is connected to the first circuit node 1. Through the coupling capacitor CK, this increase, in potential in turn influences the first circuit node 1 and increases its potential which until now has had the value of "half the supply voltage potential plus the read signal elevation $V_L$". The maximum possible potential increase amounts to approximately ¼ of the read signal elevation $V_L$. However, as a result of the above-described potential compensation, the potential connected to the first controlled terminal of the transfer transistor ÜT is reduced by the same amount by which it increases at the other controlled terminal of the transfer transistor ÜT. This, however, influences the second circuit node 2 through its assigned coupling capacitor CK, i.e. the potential connected to the second circuit node 2 is reduced (assuming that the dimensioning of the two coupling capacitors CK is identical) by the same amount as the potential connected to the first circuit node 1 increases.

Overall, in this embodiment a potential difference between the two circuit nodes 1 and 2 at the level of "the read signal elevation $V_L$ + (twice potential increase $V_O$)" can be achieved. On the basis of the previously-stated values ($V_L = 150$ mV, potential increase $V_O = V_L/4$), a potential difference of 225 mV occurs which is to be evaluated by the trigger circuit KS. This enormously increases the reliability with regard to correct evaluation. On the other hand, however, the circuit developer can exploit the advantages of the evaluating circuit in accordance with the invention by dimensioning the circuit components which generate the signals to be evaluated (which are memory or storage cells in the example) to be such that smaller signals occur. In dynamic semiconductor memories this means that the circuit developer uses memory or storage cells having a correspondingly smaller capacitance. Since the capacitance values are directly proportional to the area requirement of the assigned capacitors, an economy in terms of space can be achieved. This represents an important aspect of modern integrated circuit technology.

In the embodiments shown in FIGS. 2 and 3, the switching transistors ST simultaneously serve as isolating transistors TT, in accordance with the invention.

The embodiment according to FIG. 2 is based on the same circuit principle as that shown in FIG. 1: firstly the circuit node 1 is brought to the original half supply potential which has been increased or reduced by the amount of the signal elevation $V_L$ of the signal to be evaluated, maintaining the half supply potential across the circuit node 2. Then the isolating transistors TT, which in the embodiment of FIG. 2 are identical to the switching transistors ST of known proven circuits, are blocked and the transfer transistor ÜT is switched into conductivity. As a result, a potential compensation takes place over the controlled path (drain-source) of the transfer transistor ÜT. This results in an increase in potential at the second electrode of the coupling capacitor CK, which is connected at its first electrode to the first circuit node 1, and also at the first circuit node 1 itself. The potential compensation through the transfer transistor ÜT simultaneously results in a reduction in the potential at the second electrode of the coupling capacitor CK, which is connected by its first terminal to the second circuit node 2, as a result of which a reduction in potential also takes place at the second circuit node 2. The potential difference which occurs between the two circuit nodes 1, 2 and which is subsequently to be evaluated by the trigger circuit KS (triggered by a change in the evaluating signal φBW), is increased by means of the above-described advantageous circuitry measures, as in the embodiment shown in FIG. 1, in comparison to the known evaluating circuits, which also results in the advantages described with reference to FIG. 1.

The advantageous embodiment depicted in FIG. 3 is optimized as regards the signal increase which can be achieved, i.e. the potential increase (or reduction) $V_o$ is greater than in the embodiments previously described. Thus in a semiconductor memory the memory or storage cells of the memory or storage cell array can be further reduced in size. This embodiment will be explained in detail below in association with the pulse diagram of FIG. 4.

It will again be assumed that the evaluating circuit corresponding to the invention is used in a semiconductor memory to evaluate an item of information, read out from a memory or storage cell SZ, as the signal to be evaluated (generally referred to as a "read signal"), where the memory or storage cell SZ is connected to the bit line BL. The value of the logic information amounts to "1". The potential curves which occur when a logic "0" is read out are shown in broken lines where they differ from those which occur when a logic "1" is read out. The assumed half supply voltage potential has been shown in a dotted line where readout and evaluation result in a elevation therefrom, and has been given the reference numeral "½".

In comparison to the previously-described embodiments, the integrable evaluating circuit includes at least one further transfer transistor ÜT, the gate of which is also connected to the connecting signal ÜS, as a control terminal. The first controlled terminal (drain) of the transfer transistors ÜT in each case is connected to the second terminal of one of the coupling capacitors CK. These two further connection points are given reference symbols C1 and C2 in FIG. 3. The other controlled terminal (source) of the first of the transfer transistors ÜT is connected both to the other controlled terminal of the first of the two isolating transistors TT and through the current-conducting path (channel) of a first further isolating transistor WTT, to the second electrode of the other coupling capacitor CK (at a further connection point C2). Similarly, the other controlled terminal (source) of the other of the transfer transistors ÜT is connected both to the other control terminal of the other of the two isolating transistors TT and through the current-conducting path (channel) of a second further isolating transistor WTT, to the second electrode of the first coupling capacitor CK (at a further connection point C1). As in the embodiment shown in FIG. 2, the switching transistors ST simultaneously serve as isolating transistors TT.

At the beginning of a read-out and evaluation cycle (designated by the time t0 in FIG. 4), the following signals are in the electrically inactive state at logic "0": (word) selection line Aj for the selective operation of a memory or storage cell SZ, transfer signal ÜS, evaluating signal φBW. Only the isolating signal TS is electrically-active at logic "1".

At a time t1, a memory or storage cell SZ of the bit line BL is read out onto the bit line through the (word) selection line Aj. As already mentioned, it will be assumed below that a logic "1" is read out. The read signal will be assumed to have a signal elevation of $V_L$. Until the time t1, the following lines and circuit nodes exhibited half the supply voltage potential ("½") as agreed: bit line BL, reference line RL, (further) circuit nodes C1, C2, 1 and 2. When read-out has taken place, the bit line BL, the first circuit node 1 (switching and isolating transistors ST, TT are switched through by means of the isolating signal TS) and the further circuit node C2 (the first further isolating transistor WTT is switched through by the isolating signal TS) assume the potential "½×the supply voltage +the signal elevation $V_L$", which signifies an increase in potential when a logic "1" is read out and a reduction in potential when a logic "0" is read out. The potentials of the reference line RL, the second circuit node 2 and the further circuit node C1 remain unchanged (the second further isolating transistor WTT is conductive as a result of the isolating signal TS).

At the time t2, the isolating signal TS becomes electrically inactive and the isolating transistors TT and further isolating transistors WTT block. As soon as possible thereafter, but at the earliest following the blockage, the transfer signal ÜS becomes electrically active at the time t3, i.e. the transfer transistors ÜT are switched into conductivity. A potential compensation then takes place through the transfer transistors ÜT between the bit line BL and the further circuit node C1 and between the reference line RL and the further circuit node C2. The bit line and reference line capacitances $C_{BL}$, which are very high in value compared to the capacitances of the memory or storage cells SZ, the capacitances of the coupling capacitors CK, and the self-capacitance $C_{BW}$ of the evaluating circuit, cause the bit line BL and the reference line RL to only slightly change their potential. This in turn causes the further circuit node C1 to increase its potential (or to reduce it in the case of logic "0"), whereas the further circuit node C2 again assumes approximately the middle potential "½supply voltage". In the case of a logic "1" this means a reduction in potential and in the case of a logic "0" an increase. The potential changes at the further circuit nodes C1 and C2 bring about a corresponding change in potential at the two circuit nodes 1 and 2, through the coupling capacitors CK. The first circuit node is increased by an amount $V_o$ ($V_o < V_L$; reduced in the case of logic "0"), whereas the second circuit node 2 is reduced by the same amount $V_o$ (in the event that the coupling capacitors CK have equal capacitance values). Therefore a voltage ("potential at circuit node 1")−("potential at circuit node 2")=("½"+$V_L$+$V_o$)−("½"−$V_o$)=$V_L$+$2V_o$ occurs between the two circuit nodes 1 and 2. This value is also attained when a logic "0" is read out, as can easily be proved by those skilled in the art and is also depicted in FIG. 4 in broken line values.

As mentioned above, the read signal elevation of conventional semiconductor memory or storage cells is approximately 150 mV. The signal-enhancement circuit SÜS of the evaluating circuit in accordance with the invention permits a potential change of $V_o = V_L/2$ with respect to each signal line, i.e. a read signal with double amplitude is available for evaluation ($V_L + 2(V_L/2)$) between the two signal lines (when the memory or storage cell capacitances are unchanged).

As is generally known, the trigger circuit KS is maintained in a state of unstable equilibrium until the time t4. At the time t4 it is activated by means of an evaluating signal φBW (whether this is done directly by the evaluated signal, indirectly through a transistor as in FIG. 3, or by a complicated function generator, is of no significance to the invention). As a result, the originally read-out information is evaluated and the two circuit nodes 1, 2 assume the levels "0" and approximately "½".

At the time t0, the transfer transistors ÜT are blocked again as a result of the de-activation of the transfer signal ÜS. Then, at the time t6, the isolating signal TS becomes electrically active and the isolating transistors TT and further isolating transistors WTT become conductive. Accordingly, the further circuit node C1 assumes the potential of the reference line RL and the further circuit node C2 assumes the potential of the bit line BL. Regardless of what takes place at the further circuit nodes C1 and C2, the information at the first circuit node 1 (which is logic "1" in the example) can be rewritten into the memory or storage cell through the bit line by means of a non-illustrated refresh circuit. This procedure is already known.

Although the invention has been described in terms of the read-out of information onto the bit line BL, it will be clear to those of skill in the art that the terms bit line BL and reference line RL are interchangeable with regard to the evaluating circuit, without this having the least influence on the functioning of the circuit.

It has proved advantageous for the capacitance values of the coupling capacitors CK to be identical to one another.

It has also proved advantageous for the capacitance values of the coupling capacitors CK to be approximately equal to the self-capacitance $C_{BW}$ of the trigger circuit KS.

Since the currently-attainable self-capacitance $C_{BW}$ of the trigger circuit KS is 20 to 40 fF, it is advisable for the coupling capacitors to have capacitance values of 20 to 40 fF.

It is also advantageous to provide for the transfer transistors ÜT to be switched into conductivity no earlier than when the isolating transistors TT and the further isolating transistors WTT are reliably blocked.

It is also advantageous for the flank or lateral edge of the transfer signal ÜS, which brings the transfer signal into the active state (and thus switches the transfer transistors ÜT into conductivity), to have a less steep flank or lateral edge gradient than the corresponding opposing flank or lateral edge.

It is also advantageous for the flank or lateral edge of the isolating signal TS which brings the isolating signal into the active state (and thus switches the isolating transistors TT and where appropriate the further isolating transistors WTT into conductivity), to have a less steep flank or lateral edge gradient than the corresponding opposing flank or lateral edge.

The foregoing is a description corresponding in substance to German Application P No. 36 25 020.1, dated July 24, 1986, the International priority of which is being claimed for the instant application, and which is hereby made part of this application. Any material discrepancies between the foregoing specification and the aforementioned corresponding German application are to be resolved in favor of the latter.

I claim:
1. Integrable evaluating circuit, comprising:
   a trigger circuit,
   a first and second circuit node, both of which serve both as inputs and as mutually-complementary outputs for said trigger circuit,
   a pair of signal lines exhibiting the same potential in a rest state,
   switching transistors each being connected between a respective one of said two circuit nodes and a respective signal line of said pair of signal lines,
   wherein each switching transistor has a first current-carrying connection connected with a respective one of said circuit nodes, has a second current-carrying connection connected with a respective one of said signal lines, and has a control connection connected with an isolation signal having a signal elevation of a given amount,
   a signal-enhancement circuit connected between said trigger circuit and said pair of signal lines,
   said switching transistors initially connecting a signal occurring on a given one of said two signal lines with its signal elevation to said circuit node connected to said given signal line,
   wherein said switching transistor connected to said given one of said two signal lines operates to switch the signal from said circuit node connected to said given signal line,
   wherein said signal-enhancement circuit operates to increase the potential of said circuit node connected to said given signal line by a given amount while simultaneously reducing the potential at the other one of said two circuit nodes as a result of a potential shift, and
   wherein said signal-enhancement circuit operates to reduce the potential of said circuit node connected to said given signal line and to increase the potential of the other one of said two circuit nodes if the signal has a negative signal elevation.

2. Integrable evaluating circuit according to claim 1, wherein:

said signal-enhancement circuit includes at least first and second coupling capacitors each having first and second electrodes, said first electrode of said first coupling capacitor being connected to said first circuit node, and said first electrode of said second coupling capacitor being connected to said second circuit node, said signal-enhancement circuit includes a first transfer transistor having a gate in the form of a control terminal receiving a transfer signal, and controlled terminals each being connected to said second electrode of a respective one of said coupling capacitors, and isolating transistors each having one controlled terminal connected to a respective one of said first electrodes of said coupling capacitors, a gate receiving an isolating signal, and another controlled terminal connected to a respective one of said second electrodes of said coupling capacitors.

3. Integrable evaluating circuit according to claim 2, wherein said switching transistors have current-conducting paths each being connected between a signal line of said pair of signal lines and said trigger and signal-enhancement circuits.

4. Integrable evaluating circuit according to claim 2, including two further isolating transistors each having a current-conducting path, said signal-enhancement circuit including at least one further transfer transistor having a gate in the form of a control terminal receiving the transfer signal, a first controlled terminal of each of said transfer transistors being connected to said second electrode of a respective one of said coupling capacitors, and a second controlled terminal of each of said transfer transistors being connected to said other controlled terminal of a respective one of said isolating transistors and through said current-conducting path of a respective one of said further isolating transistors to said second electrode of the other one of said coupling capacitors, said isolating transistors operating to isolate said trigger circuit from the respective signal lines of the enhancement circuit in response to said isolating signal.

5. Integrable evaluating circuit according to claim 2, wherein said switching transistors serve as isolating transistors.

6. Integrable evaluating circuit according to claim 2, wherein said coupling capacitors have equal capacitance values.

7. Integrable evaluating circuit according to claim 1, wherein said trigger circuit has a self-capacitance value and said coupling capacitors have capacitance values approximately equal to said self-capacitance value.

8. Integrable evaluating circuit according to claim 7, wherein said capacitance values of said coupling capacitors are between 20 and 40 fF.

9. Integrable evaluating circuit according to claim 2, wherein said transfer transistors are switched into conductivity at the earliest when said isolating transistors are blocked.

10. Integrable evaluating circuit according to claim 2, wherein said transfer signal has a lateral edge bringing said transfer signal into an active state with a less steep lateral edge gradient than a corresponding opposing lateral edge thereof.

11. Integrable evaluating circuit according to claim 2, wherein said isolating signal has a lateral edge bringing said isolating signal into an active state with a less steep lateral edge gradient than a corresponding opposing lateral edge thereof.

* * * * *